United States Patent
Sano

(10) Patent No.: US 6,459,099 B1
(45) Date of Patent: Oct. 1, 2002

(54) PHOTOINTERRUPTER AND CASE THEREOF

(75) Inventor: Masashi Sano, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/806,298

(22) PCT Filed: Oct. 1, 1999

(86) PCT No.: PCT/JP99/05452

§ 371 (c)(1),
(2), (4) Date: Mar. 29, 2001

(87) PCT Pub. No.: WO00/21141

PCT Pub. Date: Apr. 13, 2000

(30) Foreign Application Priority Data

Oct. 2, 1998 (JP) ............................................. 10/280607

(51) Int. Cl.$^7$ ............................................. H01L 27/15
(52) U.S. Cl. ............................................. 257/82; 257/99
(58) Field of Search ........................ 257/82, 99; 438/25, 438/29; 250/551, 231.1

(56) References Cited

U.S. PATENT DOCUMENTS 5,436,472 A * 7/1995 Ogawa ........................ 257/82
5,655,042 A * 8/1997 Atanivich et al. ............. 385/88

FOREIGN PATENT DOCUMENTS

| JP | 61-119369 | 7/1986 | ........... H01L/31/12 |
| JP | 03-49404 | 10/1991 | ........... H01L/31/12 |
| JP | 6-097488 | 4/1994 | ........... H01L/31/12 |
| JP | 6-50365 | 7/1994 | ........... H01L/31/12 |

* cited by examiner

Primary Examiner—Olik Chaudhuri
Assistant Examiner—Douglas A. Wille
(74) Attorney, Agent, or Firm—Michael D. Bednarek; Shaw Pittman LLP

(57) ABSTRACT

A case (3) of a photointerrupter (A) includes a pair of projections (35) for preventing a light source (1) and a photodetector (2) from coming out of a respective one of paired receiving portions (30). Each of the projections (35) is connected to a respective first wall (32A) defining the respective receiving portion (30) of the case on an extension line of a respective slit (34) for light transmission. Therefore, the case (3) need not be formed with a large slit other than the slit (34), so that disturbing external light is less likely to enter the receiving portions (30).

11 Claims, 10 Drawing Sheets

PHOTOINTERRUPTER AND CASE THEREOF

TECHNICAL FIELD

The present invention relates to a photointerrupter used or detecting a desired object or desired part of an object. It also relates to a case used for such a photointerrupter.

BACKGROUND ART

A typical prior art photointerrupter, which is disclosed in JP-U-6-50365 for example, has such a structure as shown in FIGS. 12 and 13 of the accompanying drawings. The illustrated photointerrupter B comprises an LED lamp 7, a photodetector 8 and a case 9. The LED lamp 7 as a light emitting element comprises an LED chip 70 sealed in a transparent resin 71. The LED lamp has two leads 72. The photodetector 8 comprises a light receiving element sealed in a transparent resin 81. The photodetector has two leads 82. The case 9 includes a pair of receiving portions 90 for receiving the LED lamp 7 and the photodetector 8, respectively, and a plurality of walls for defining the receiving portions.

Each of the receiving portions 90 has an opening 91 at the bottom. The plurality of walls include a pair of opposite walls 92A each of which is formed with a slit 94 for allowing light emitted from the LED lamp 7 to travel toward the photodetector 8. When an object to be detected (not shown) exists between the slits 94, the object blocks light from the LED lamp 7. As a result, light cannot be received by the photodetector 8 so that signal output from the two leads 82 stops. In this way, the presence or absence of an object is checked.

The case 9 further includes another pair of walls 92B each of which is formed with a projection 95 having an increasing thickness toward its upper end. The upper end of each projection 95 partially extends into the corresponding receiving portion 90. With this structure, the upper end of each projection 95 is brought into engagement with the resin 71 of the LED lamp 7 or the resin 81 of the photodetector 8, thereby fixing the LED lamp 7 or the photodetector 8 in the corresponding receiving portion 90. In the photointerrupter B, therefore, the LED lamp 7 and the photodetector 8 need not be press-fitted into the receiving portions 90, so that deformation of the LED lamp 7 and the photodetector 8 due to such press fit can be avoided. Moreover, since a lid which is separate from the case 9 need not be provided to fix the LED lamp and the photodetector 8, it is possible to reduce the number of parts of the photointerrupter.

However, the above-described prior art apparatus has the following problems.

In the prior art apparatus, the slits 94 for light transmission are provided in the walls 92A of the case 9, whereas the projections 95 are provided in the walls 92B which are separate from the walls 92A. Therefore, in forming the case 9 by resin molding, large openings 99 for forming the projections 95 are provided in the walls 92B. Specifically, as shown in FIG. 14, when the case 9 is formed by using a mold 4C comprising an upper mold member 48 and a lower mold member 49, portions 48a of the upper mold member 48 need to be disposed above clearances 95' for forming the projections 95 in the case 9. As is clear from the configuration of the projections 95 shown in FIG. 12, part of the upper mold member 48 needs to extend on both sides of the corresponding clearance 95' for forming the projection 95. Accordingly, the case is correspondingly formed with openings 99.

Since each of the walls 92B of the case 9 is formed with an opening 99, disturbing external light is likely to enter the corresponding receiving portion 90 at the opening 99. In the prior art apparatus, therefore, disturbing external light is received by the photodetectors 8, which leads to malfunction of the apparatus.

DISCLOSURE OF THE INVENTION

It is an object of the present invention to provide a photointerrupter and a case for a photointerrupter which are capable of eliminating or reducing the problems of the above-described prior art apparatus.

In accordance with a first aspect of the present invention, there is provided a photointerrupter comprising a light source, a photodetector, and a case. The case includes a pair of receiving portions each of which is open at one end for receiving the light source or the photodetector, and a plurality of walls defining the pair of receiving portions. The plurality of walls of the case include a pair of first walls each of which is formed with a respective elongated slit. The case further includes a pair of projections each of which projects into a respective one of the receiving portions for preventing the light source or the photodetector from coming out of the receiving portion. Each projection is connected to a respective one of the first walls on an extension line of the respective slit.

Preferably, each projection may be connected to a longitudinal end edge of the respective slit.

Preferably, the case may be made of a synthetic resin, and the pair of projections may be integral with the plurality of walls.

Preferably, each projection may include a base end connected to the respective first wall and a tip end projecting into the respective receiving portion for engagement with one of the light source and the photodetector.

Thus, according to the present invention, in forming the case of the photointerrupter by resin-molding using a mold, part of the mold for forming the slit can be utilized for forming the projection. Therefore, unlike the prior art apparatus, the case of the present invention is not formed with a large opening at portions other than the first walls at which the slits are formed. Therefore, disturbing external light is less likely to enter the receiving portions, which enhances reliability of detection by the photointerrupter.

Preferably, each projection may be elastically deformable for allowing movement of the tip end toward the respective first wall.

With this structure, each of the light source and the photodetector can be easily inserted into the corresponding receiving portion by pushing the tip end of the corresponding projection by the light source or the photodetector toward the corresponding first wall. After the light source and the photodetector are inserted into the respective receiving portions, the tip end of each projection projects into the corresponding receiving portion due to the elastic recovery. Thus, fixing of the light source and the photodetector can also be performed easily.

Preferably, a rounded connection may be provided between the base end of each projection and the respective first wall.

With this structure, a gradually curving outer configuration is provided at the connection between the base end of each projection and the corresponding first wall. Therefore, even when a force is applied to the tip end of each projection and the base end is subjected to a bending stress, it is possible to prevent a stress concentration on a particular portion of the base end. Accordingly, even when a pulling force (a force to pull out the light source or the photodetector from the corresponding receiving portion through the opening) is generated and each of the projection is pressed by the light source or the photodetector, it is possible to prevent the projection from easily breaking. Thus, the light source and the photodetector can be reliably fixed.

Preferably, each of the light source and the photodetector may include a bottom surface facing the opening of the respective receiving portion and a side surface facing the respective first wall, and the tip end of each projection may include a first surface and a second surface for engagement with the bottom surface and the side surface, respectively.

With this structure, since the second surface of each projection engages the side surface of the light source or the photodetector, the projection is prevented from rotating in a direction in which the second surface faces toward the side surface of the light source or the photodetector. Therefore, even when a pulling force is exerted on the light source or the photodetector which, as a result, presses the first surface of the corresponding projection toward the opening of the corresponding receiving portion, it is possible to prevent the projection from easily rotating in that direction. Thus, fixing of the light source and the photodetector becomes more reliable.

Preferably, each projection may be connected to the respective first wall at a portion away from a longitudinal end edge of the respective slit, and the projection is wider than the slit.

With this structure, even in the case where each slit needs to be narrowed to enhance the detection ability of the photointerrupter, the projection can be made wider than the slit to have a sufficient strength.

Preferably, the light source may comprise a light emitting element sealed in a resin, and a plurality of leads projecting from the resin in electrical connection with the light emitting element.

Preferably, the photodetector may comprise a light receiving element sealed in a resin, and a plurality of leads projecting from the resin in electrical connection with the light receiving element.

In accordance with a second aspect of the present invention, there is provided a case for a photointerrupter comprising a pair of receiving portions each of which is open at one end, a plurality of walls defining the pair of receiving portions. The plurality of walls of the case include a pair of first walls each of which is formed with a respective elongated slit. The case further includes a pair of projections each of which projects into a respective one of the receiving portions for preventing the light source or the photodetector accommodated in the respective receiving portion from coming out of the receiving portion. Each projection is connected to the respective first wall on an extension line of the respective slit.

The case of the photointerrupter having the above-described structure can obtain the same advantages as those obtained by the photointerrupter provided in accordance with the first aspect of the present invention.

Other features and advantages of the present invention will become clearer from the detailed description given below with reference to the accompanying drawings.

BEST MODE FOR CARRYING OUT THE INVENTION

Preferred embodiments of the present invention will be described below with reference to the accompanying drawings.

Figure 1:
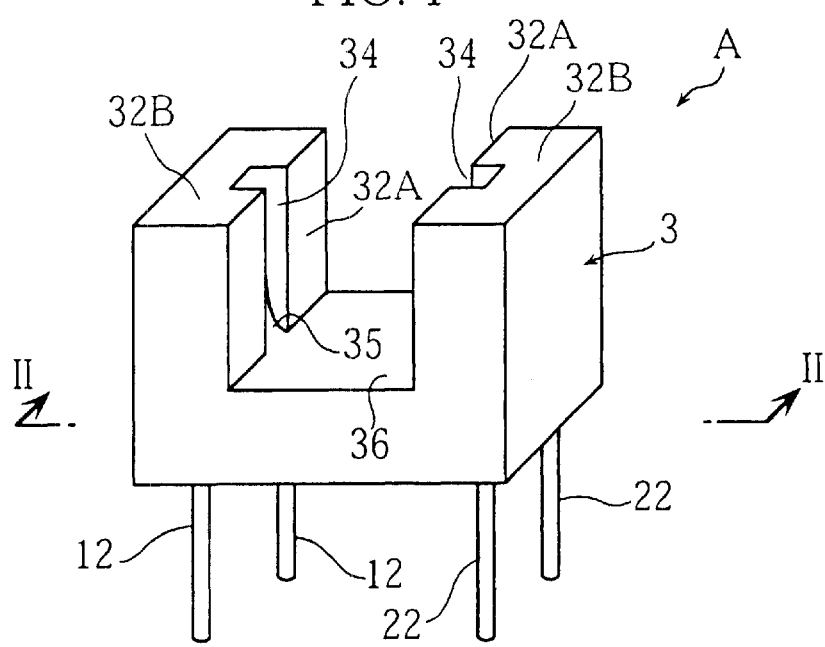
FIG. 1 is a perspective view showing an example of photointerrupter in accordance with the present invention.
Figure 2:
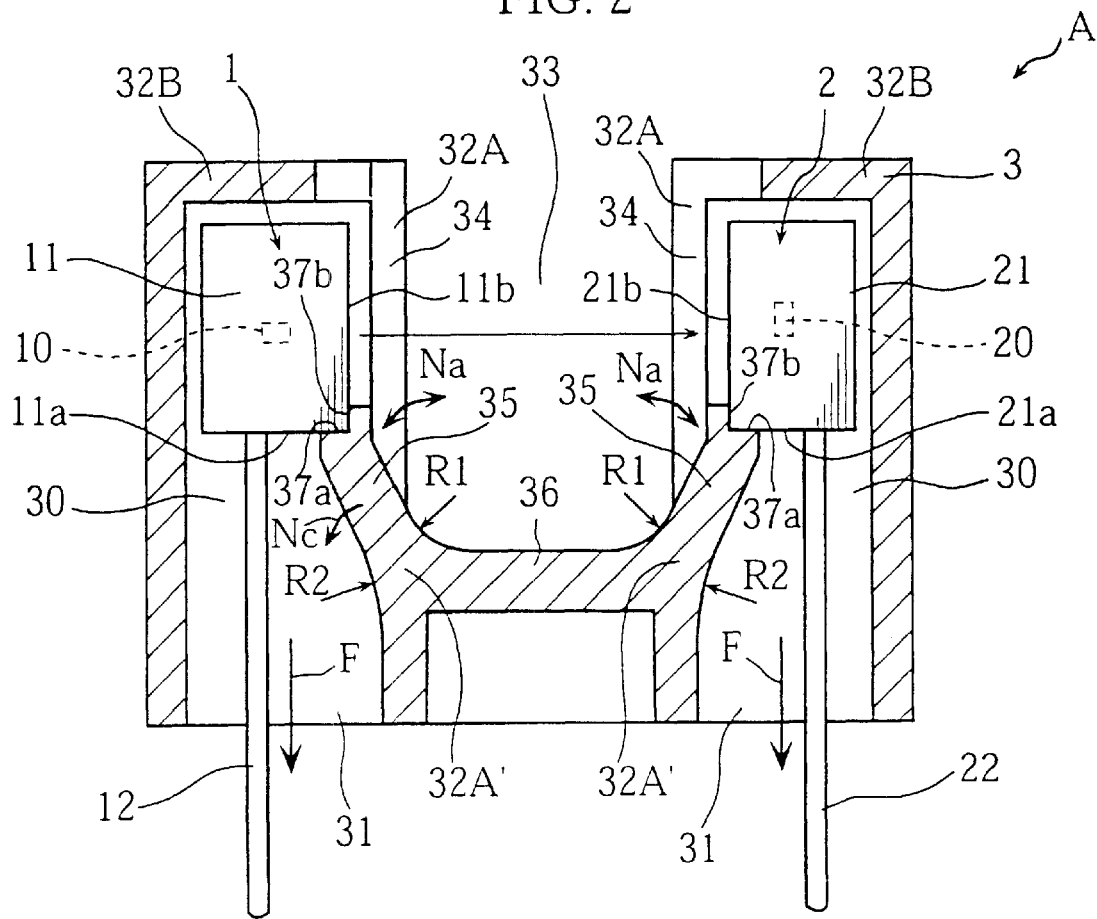
FIG. 2 is a sectional view taken along lines II—II in FIG. 1.
Figure 3:
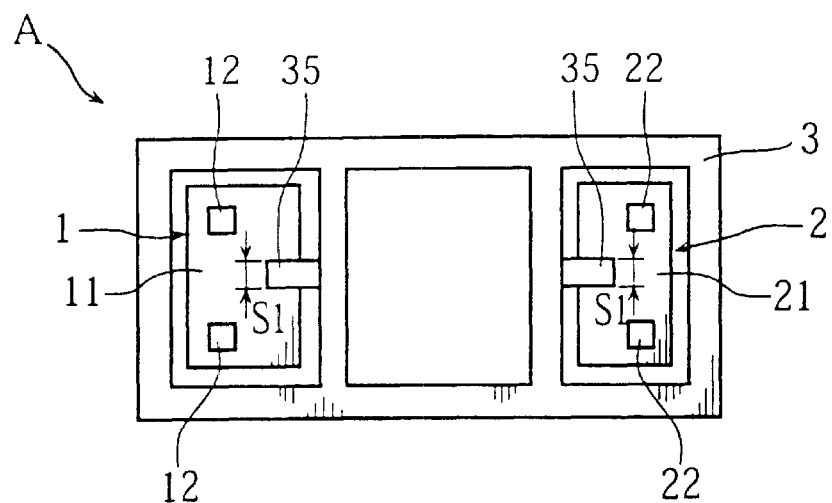
FIG. 3 is a bottom view of the photointerrupter shown in FIG. 1.

FIGS. 1 through 3 illustrate a first embodiment of the present invention. The illustrated photointerrupter A is a transmission type photointerrupter which comprises an LED lamp 1, a photodetector 2 and a case 3.

The LED lamp 1 as a light emitting element comprises an LED 10 sealed in a transparent resin 11 for example. The resin 11, which is generally in the form of a parallelepiped, has a bottom surface 11a, from which project two leads 12 electrically connected to the LED 10.

The photodetector 2 comprises a photodiode 20 for example as a light receiving element and a transparent resin 21 sealing the photodiode. Similarly to the resin 11, the resin 21 is generally in the form of a parallelepiped and has a bottom surface 21a, from which project two leads 22 electrically connected to the photodiode 20.

The case 3 may be made of e.g. black polycarbonate by molding, as described later. The case 3 includes a pair of receiving portions 30 for receiving the LED lamp 1 and the photodetector 2, respectively. Each of the receiving portions 30 is in the form of square-cornered recess corresponding in shape to the resin 11 or 21 for preventing the LED lamp 1 or the photodetector 2 from changing its orientation within the receiving portion. The receiving portion 30 has a respective opening 31 at the bottom thereof for inserting the LED lamp 1 or the photodetector 2.

For defining the receiving portions 30, the case 3 includes a pair of first walls 32A, a pair of second walls 32B and a plurality of other walls, which are integral with each other. The first walls 32A face each other via a space 33. Each of the paired first walls 32A is formed with a slit 34. The provision of the slit 34, which extends in the height direction of the case 3 (vertical direction in FIGS. 1 and 2), enables the photodetector 2 to receive light emitted from the LED lamp 1. The second walls 32B, which are the upper walls of the receiving portions 30, are connected transversely to the corresponding first walls 32A. Each of the slits 34 extends into the corresponding second wall 32B.

Further, the case 3 is integrally formed with a pair of projections 35. Each of the projections 35 has a base end which is connected to a longitudinally lower edge 32A' of the slit 34 of the corresponding first wall 32A. The projection 35 rises obliquely from the lower edge 32A' so that its tip end projects deeper into the corresponding receiving portion 30 than the slit 34. However, the projection 35 can be elastically deformed for pivotal movement about its base end in a direction indicated by an arrow Na in FIG. 2. The projection 35 has a width S1 (See FIG. 3) which is equal to or smaller than that of the each slit 34.

The paired first walls 32A are connected together by a generally horizontal wall 36, and the base end of each projection 35 is connected to the corresponding one of the first walls 32A at a portion where the first wall 32A is connected to the horizontal wall 36. A rounded connection of a suitable radius R1 is provided between the base end of the projection 35 and the wall 36. Similarly, a rounded connection of a suitable radius R2 is provided between the base end and the corresponding first wall 32A.

The tip end of each projection 35 is provided with a first surface 37a oriented upward and a second surface 37b perpendicularly connected thereto. The first surface 37a engages with the bottom surface 11a of the resin 11 for the LED lamp 1 or the bottom surface 21a of the resin 21 for the photodetector 2. The second surface 37b engages a side surface 11b of the resin 11 or a side surface 21b of the resin 21. Each of the side surfaces 11b, 21b faces the corresponding first wall 32A and slit 34.

In this embodiment, the LED lamp 1 and the photodetector 2 are generally identical in outer configuration and size. Therefore, the case 3 is made symmetrical, as clearly shown in FIG. 2. However, the LED lamp 1 and the photodetector 2 may have different configurations and sizes. In such a case, the paired receiving portions 30 also have different sizes and configurations.

Figure 4:
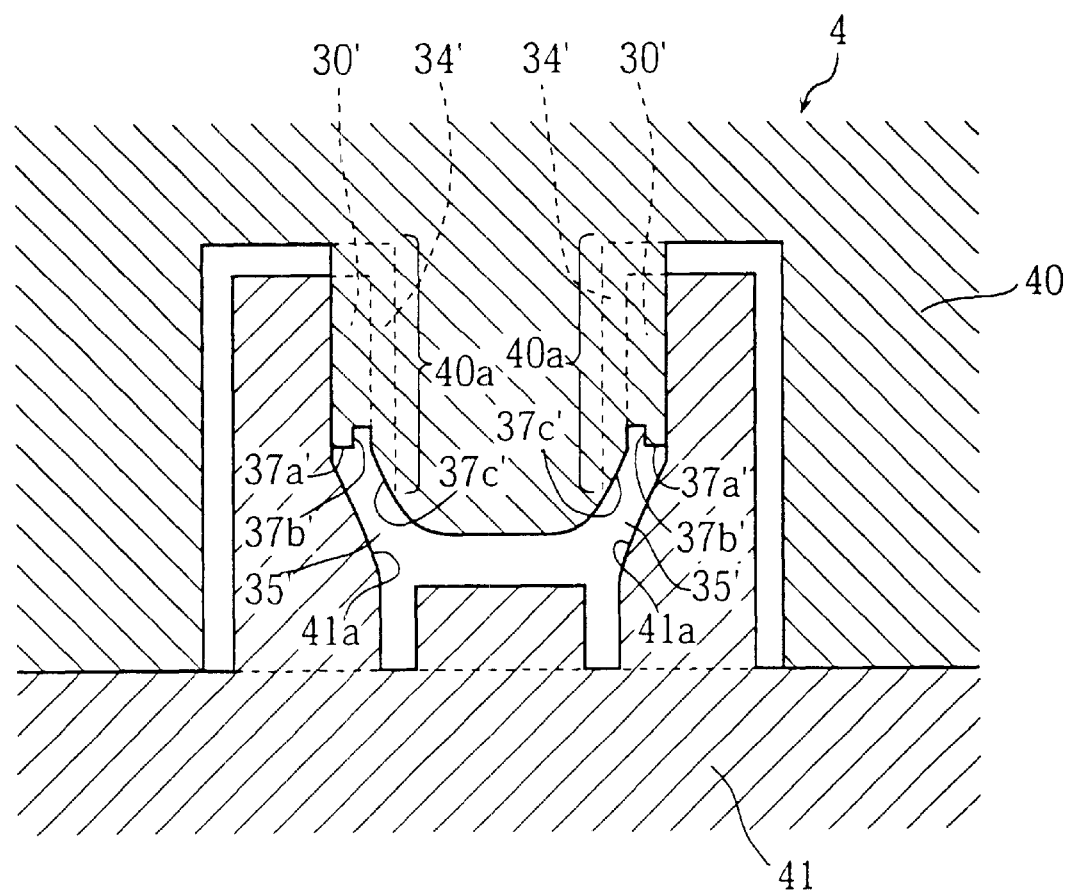
FIG. 4 is a sectional view showing an principal portion of a mold used for forming the photointerrupter.
Figure 5:
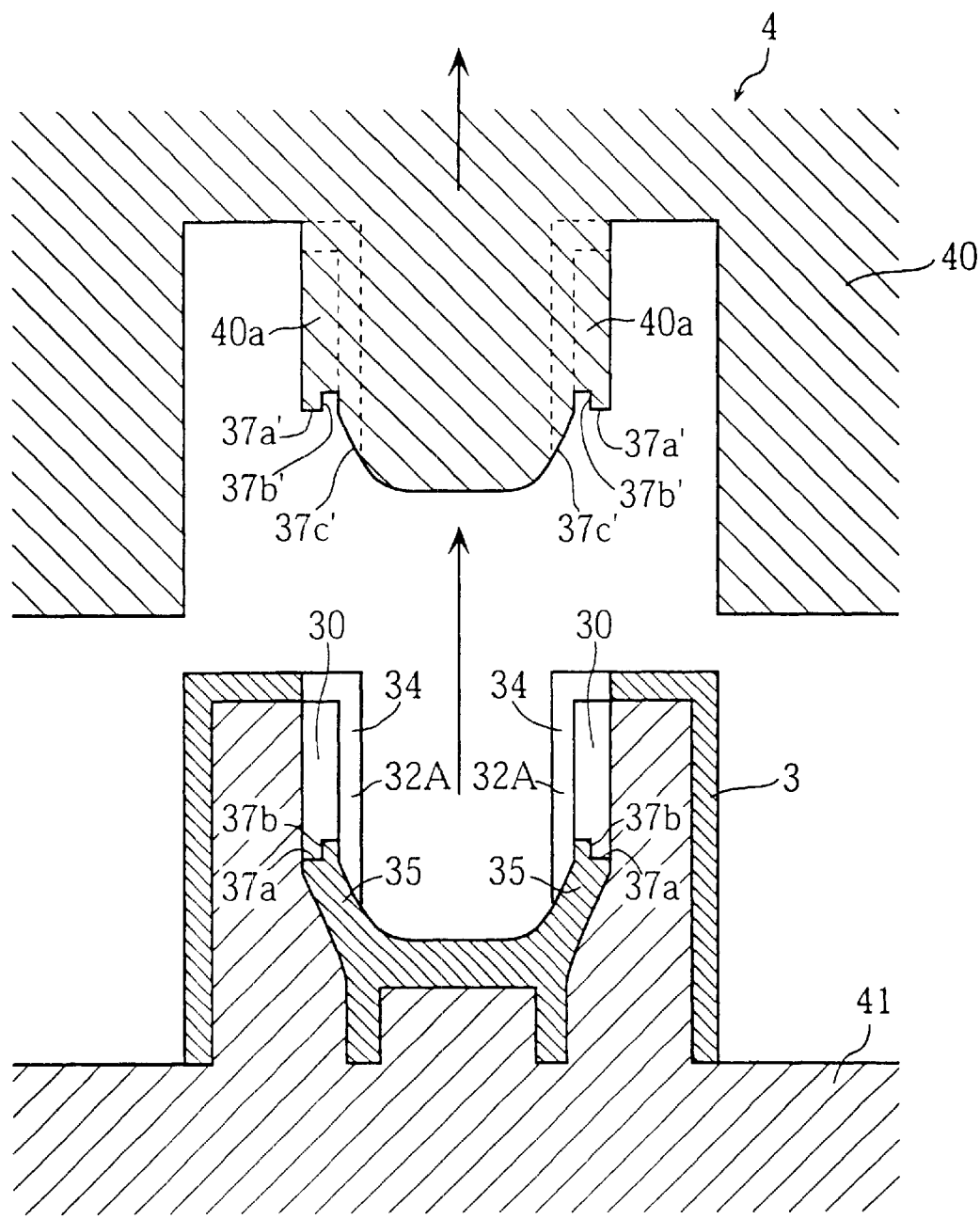
FIG. 5 is a sectional view showing the principal portion of the mold of FIG. 4 in an open state.

The case 3 is formed by using e.g. a mold 4 comprising an upper mold member 40 and a lower mold member 41, as shown in FIG. 4. The upper mold member 40 and the lower mold member 41 define a cavity for filling resin which later becomes portions of the case 3. The upper mold member 40 includes a pair of projections 40a each of which includes a portion 34' (solid portion) corresponding to the slit 34 of the case 3 and a portion 30' (solid portion) corresponding to a portion of the receiving portion 30. The projections 40a of the upper mold member 40 are located above clearances 35' for forming the projections 35 of the case 3. Each of the projections 40a has surfaces 37a', 37b' for forming the first and the second surfaces 37a, 37b of the corresponding projection 35, and a surface 37c' for forming another upper surface of the projection 35. The surfaces of the projection 35 other than those described above are formed by a surface 41a or other surfaces of the lower mold member 41.

The case 3 is formed by filling resin into the cavity of the above-described mold 4 followed by hardening the resin. After molding, the case 3 is removed from the mold 4. In lifting the upper mold member 40, the projections 40a including the surfaces 37a'~37c' move longitudinally along the slits 34 without hindrance. After the upper mold member 40 is thus lifted, the case 3 can be readily removed from the lower mold member 41. Thus, in the above-described case 3, each of the slits 34 is utilized as a slit for forming the corresponding projection 35. Therefore, slits or openings other than the slits 34 need not be formed in the case 3.

Figure 6:
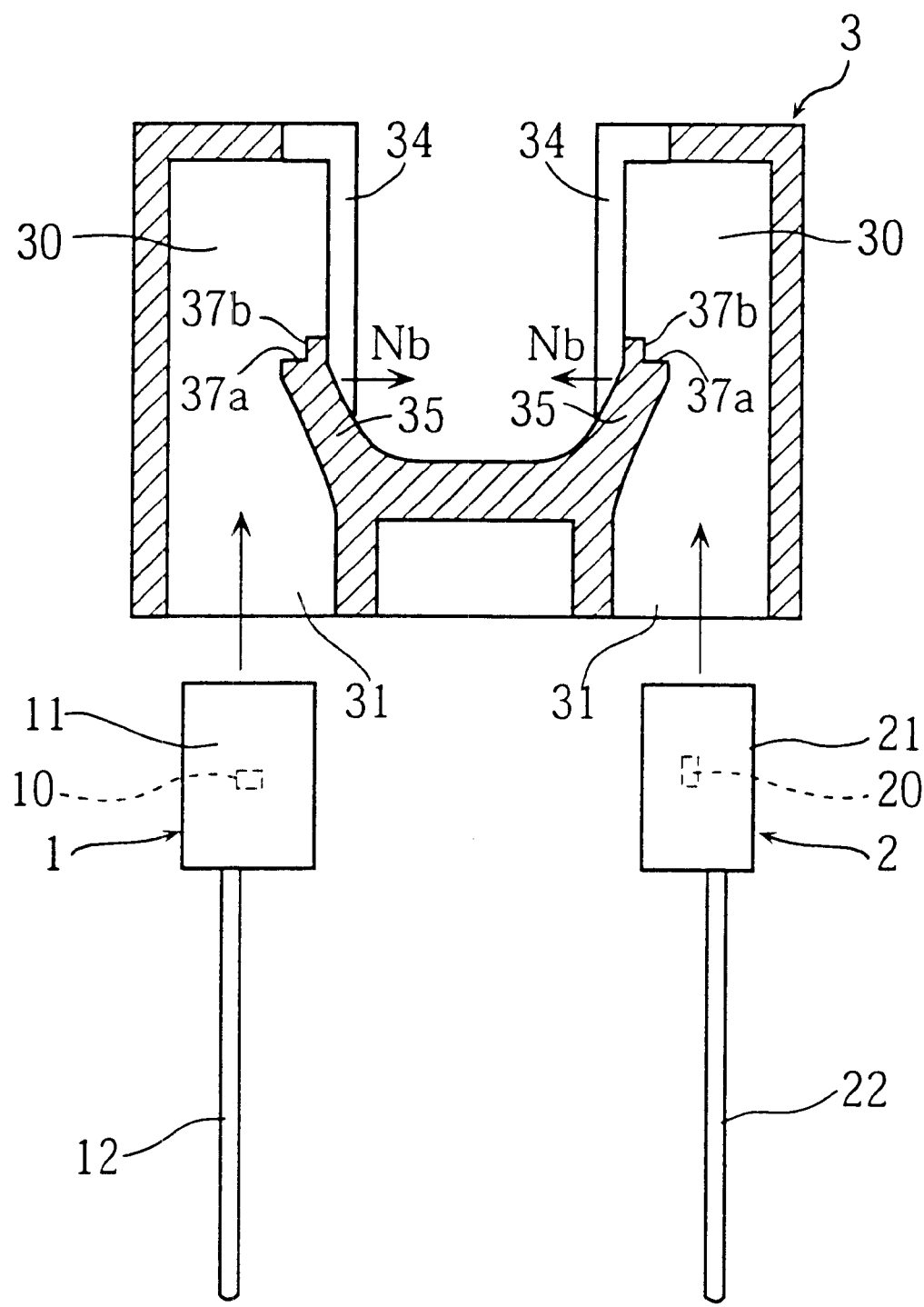
FIG. 6 is a sectional view showing a step of assembling the photointerrupter shown in FIG. 1.

The photointerrupter A having the above-described structure is prepared by inserting the LED lamp 1 and the photodetector 2 into the paired receiving portions 30 of the case 3, as shown in FIG. 6. In inserting the LED lamp and the photodetector, the resin 11 of the LED lamp 1 and the resin 21 of the photodetector 2 push the respective projection 35 in an arrow Nb direction in FIG. 6, making the projection 35 retreat toward the respective slit 34. Therefore, the projections 35 do not hinder the insertion of these components. When the LED lamp 1 and the photodetector 2 are inserted up to the upper end of the respective receiving portions 30, the projections 35 return, due to the elastic recovery, to their original state, projecting into the respective receiving portions 30, as clearly shown in FIG. 2. As a result, the first surfaces 37a of the projections 35 engage the bottom surface 11a of the resin 11 and the bottom surface 21a of the resin 21, respectively. Therefore, the projections 35 prevent the LED lamp 1 and the photodetector 2 from lowering, thereby appropriately fixing the LED lamp 1 and the photodetector 2 in respective receiving portions 30.

In the above-described photointerrupter A, the walls defining the receiving portions 30 need not be formed with slits or openings other than the slits 34. Therefore, it is possible to eliminate or lessen the possibility that disturbing external light enters the receiving portions 30 at portions other than the slits 34. As a result, the photodetector 2 can be prevented from receiving disturbing external light which may cause erroneous object detection.

When the photointerrupter A is actually used, a force F may be generated which causes the LED lamp 1 and the photodetector 2 to descend relative to the case 3 (See FIG. 2). For example, the photointerrupter A may be mounted on a desired mother board by the insertion of the leads 12, 22 into respective through-holes of the mother board. In this state, when an upward force is applied to the case 3, a force F is applied to the LED lamp 1 and the photodetector 2, as mentioned above.

In the photointerrupter A, however, the LED lamp 1 and the photodetector 2 are prevented from coming out through the respective openings 31 under a force F, as described above.

First, when a force F is applied to the LED lamp 1, the first surface 37a of the tip end of the corresponding projection 35 is pressed downward by the bottom surface 11a of the resin 11. Therefore, the projection 35 is subjected to a bending moment in an arrow Nc direction and a resulting bending stress. The stress becomes maximum at the base end of the projection 35, specifically at the connection between the base end and the corresponding first wall 32A. On the other hand, the connection is upwardly and downwardly rounded with suitable radii R1, R2, respectively, so that the cross section of the connection varies only gradually. This prevents the above-described stress from being intensively applied on a particular portion of the connection. Therefore, bending breakage of the projection 35 due to the above-described stress can be avoided. A stress concentration can be prevented even when the connection is rounded only upwardly or only downwardly. Therefore, the connection may be rounded only upwardly or only downwardly according to the present invention.

Secondly, when a force F exerted on the LED lamp 1 tends to rotate the projection 35 in the arrow Nc direction, the second surface 37b of the projection 35 strongly engages the side surface 11b of the resin 11. Therefore, the projection 35 does not further rotate in the arrow Nc direction. As a result, a bending stress is less likely to be exerted on the projection 35, which prevents the projection 35 from being bent at its base end.

Figure 7:
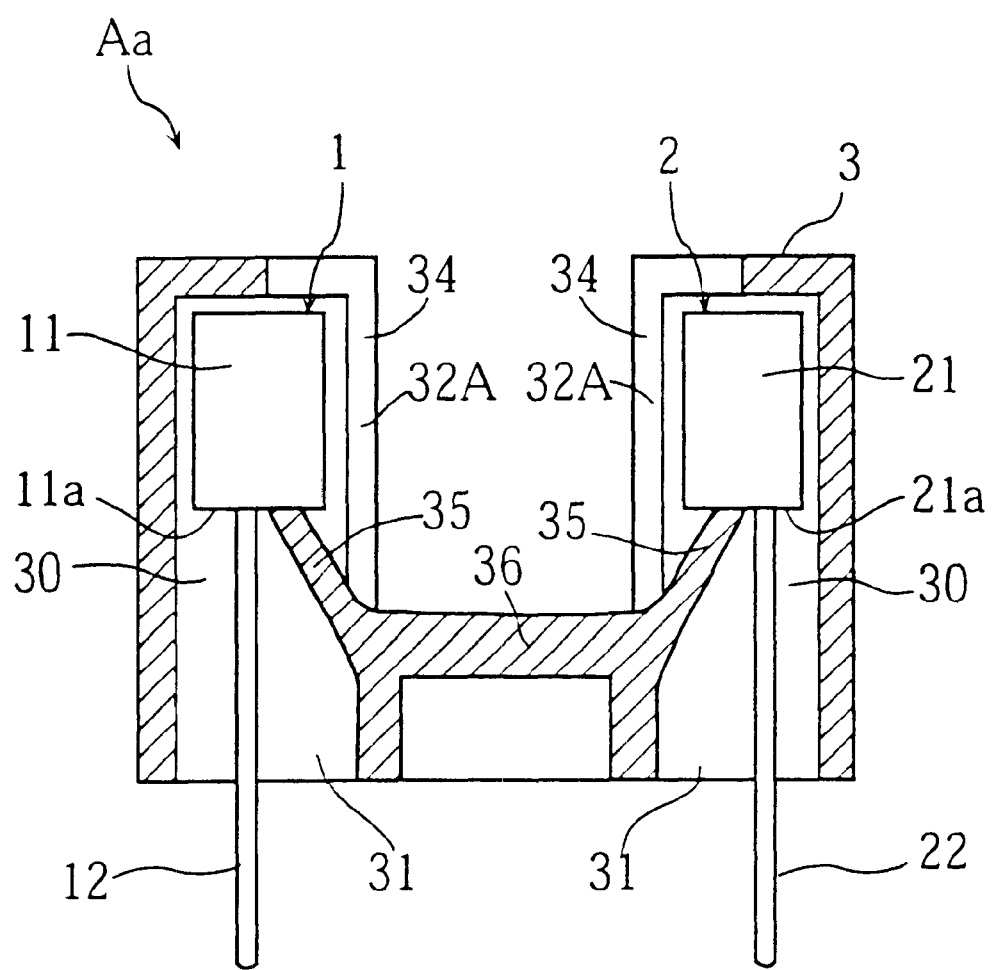
FIG. 7 is a sectional view showing another example of photointerrupter in accordance with the present invention.

The same advantages can be obtained in the case where a downward force is exerted on the photodetector 2. With the photointerrupter A, therefore, the projection 35 functions to suitably fix the LED lamp 1 or the photodetector 2 within the corresponding receiving portion 30. Since the projection 35 is thus configured to prevent bending breakage, the projection 35 need not have a large wall thickness. Therefore, it is possible to realize thickness reduction of the case 3, which enables a production cost reduction and an overall size reduction of the apparatus. FIG. 7 illustrates a second embodiment of the present invention. In FIG. 7 and the subsequent figures, the elements which are identical or similar to those of the first embodiment are designated by the same reference signs as those used for the first embodiment.

In the photointerrupter Aa shown in FIG. 7, projections 35 do not include, at their tip ends, second surfaces 37b which are provided in the first embodiment. Even with such a structure, each tip end of the paired projections 35 is brought into engagement with the bottom surface 11a of the resin 11 of the LED lamp 1 or the bottom surface 21a of the resin 21 of the photodetector 2. As a result, it is possible to prevent the LED lamp 1 and the photodetector 2 from coming out of the respective receiving portions 30 downwardly. Thus, this structure provides a function intended in the present invention.

Figure 8:
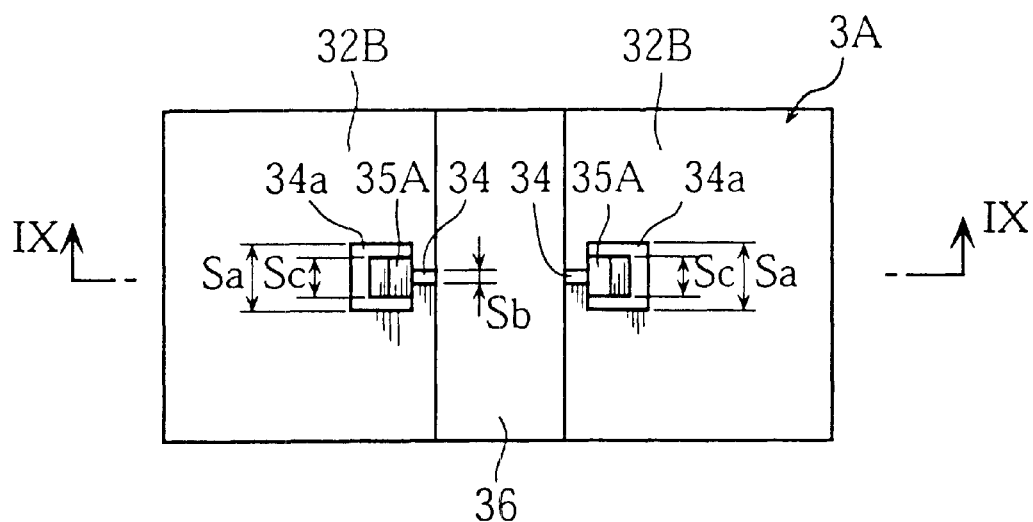
FIG. 8 is a plan view showing another example of case for a photointerrupter in accordance with the present invention.
Figure 9:
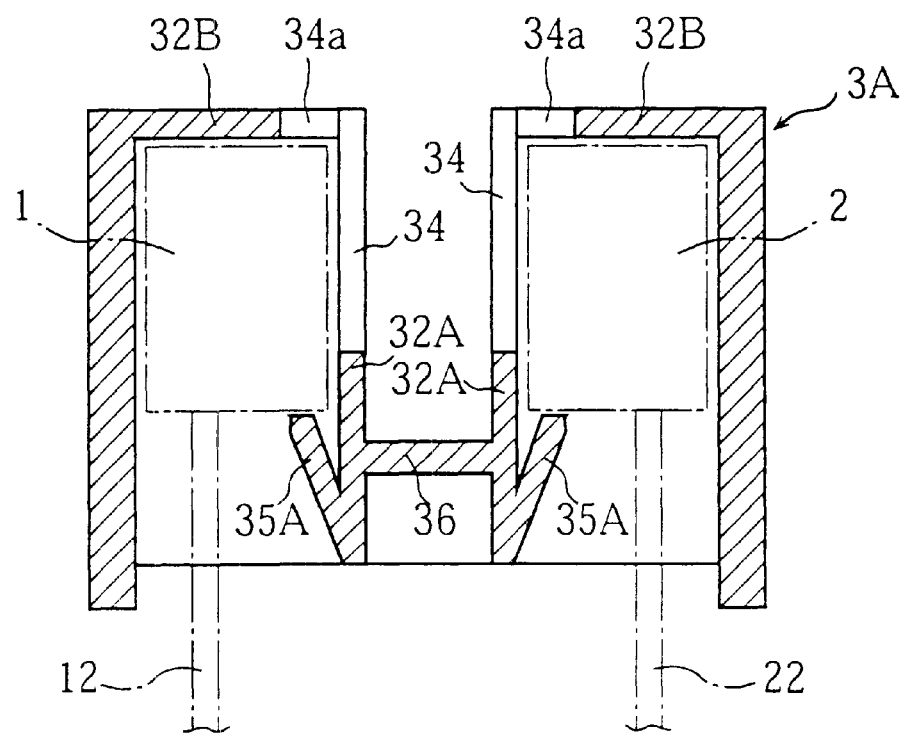
FIG. 9 is a sectional view taken along lines IX—IX in FIG. 8.

FIGS. 8 and 9 illustrate a third embodiment of the present invention.

In the third embodiment, a case 3A includes projections 35A which are formed at different positions in comparison with those of the first and the second embodiments. Specifically, in the third embodiment, each of the projections 35A has a base end which is connected to a corresponding first wall 32A below the longitudinally lower edge of a respective slit 34. The case 3A includes second walls 32B each of which is formed with an opening 34a connected to an upper portion of the corresponding slit 34. The opening 34a has a width Sa which is larger than the width Sb of the slit 34, as clearly shown in FIG. 8. As will be described later, by the provision of the slit 34a, the width Sc of the projection 35A is made larger than the width Sb of the slit 34.

Figure 10:
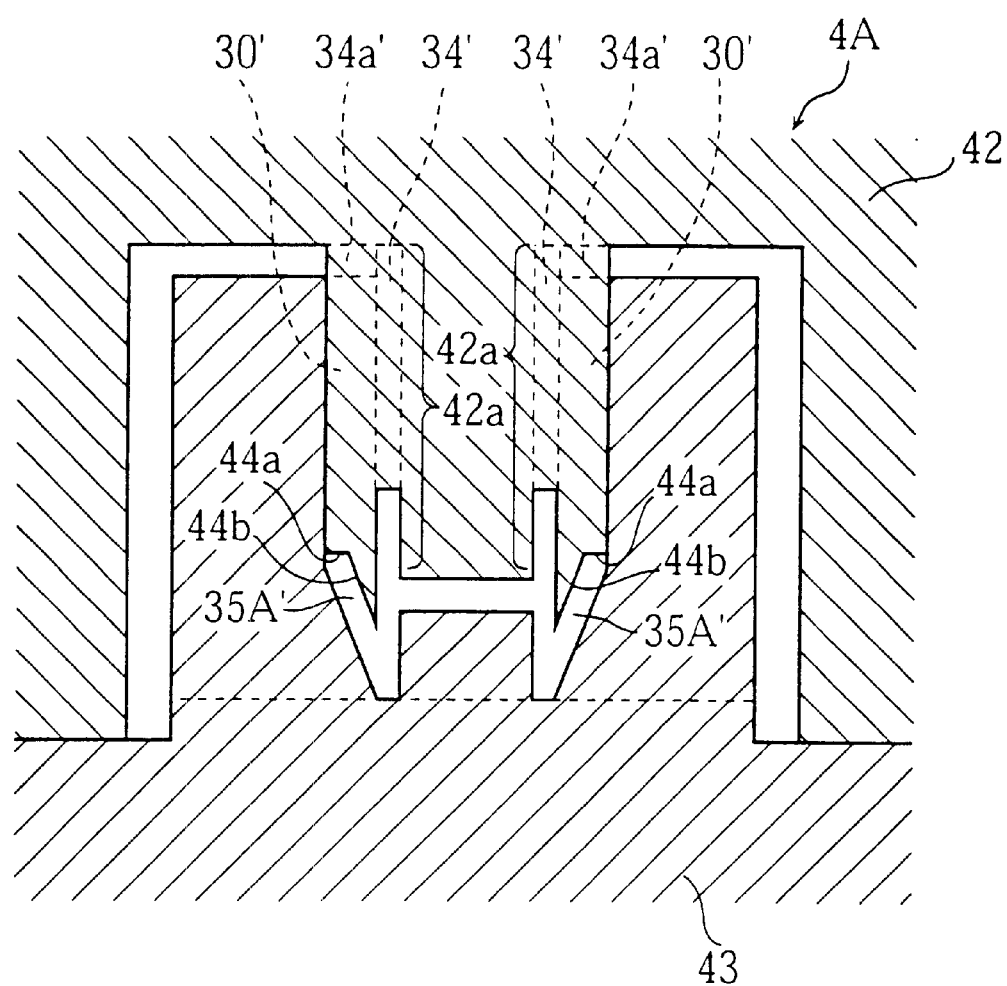
FIG. 10 is a sectional view showing a principal portion of another mold used for forming the photointerrupter.

The case 3A is formed by using e.g. a mold 4A comprising an upper mold member 42 and a lower mold member 43, as shown in FIG. 10. The upper mold member 42 includes a pair of projections 42a each of which includes a portion 34' corresponding to the slit 34 of the case 3A, a portion 34a' corresponding to the opening 34a and a portion 30' corresponding to a portion of the receiving portion 30. Each of the projections 42a has surfaces 44a, 44b for defining an upper portion of a clearance 35A' for forming the projection 35A. Other portions of the clearance 35A' are defined by the lower mold member 43.

After the case 3A is molded by filling resin into the clearances 35A' and the other clearances of the mold 4A, the projections 42A of the upper mold member 42 can be lifted along the slits 34 without hindrance. Then, the case 3A can be readily removed from the lower mold member 43. Thus, also in the third embodiment, each of the slits 34 of the case 3A is utilized as a slit for disposing and removing the upper mold member 42 for forming the corresponding projection 35A. Therefore, in the case 3A, large openings which extend vertically need not be provided in addition to the slits 34. On the other hand, each of the openings 34a of the second walls 32b can be made smaller than an opening for forming projection of a case in the prior art apparatus. As a result, disturbing external light is less likely to enter the receiving portions 30 through the openings 34a.

In this way, according to the present invention, each of the projections may be formed in the case at a longitudinal edge of the corresponding slit as in the first and the second embodiments or at a portion away from the slit as in the third embodiment. In the present invention, it is only necessary that the projection is connected to any portion of the case on an extension line of the light transmission slit.

In the third embodiment described above, each of the projections 35A has a width larger than that of the corresponding slit 34. Therefore, also in the case where the slit 34 is thin, the projection 35A can be made large to have a strength sufficient for preventing the LED lamp 1 and the photodetector 2 from coming out. The ability of the photointerrupter in detecting an object increases as the width of each slit 34 decreases. Therefore, the structure of the case 3A in the third embodiment is suitable where each of the slits 34 needs to be narrowed to enhance the detection ability. As is clear from the structure of the mold 4A shown in FIG. 10, the width Sc of each projection 35A may be equal to that of the corresponding opening 34a at the maximum. In the present invention, the projection 35A may have a width equal to that of the slit 34. In that case, the width of the opening 34a is made equal to that of the slit 34.

The specific structure of each of the components in the photointerrupter and the case in accordance with the present invention is not limited to the embodiments described above, and may be modified in various ways.

Figure 11:
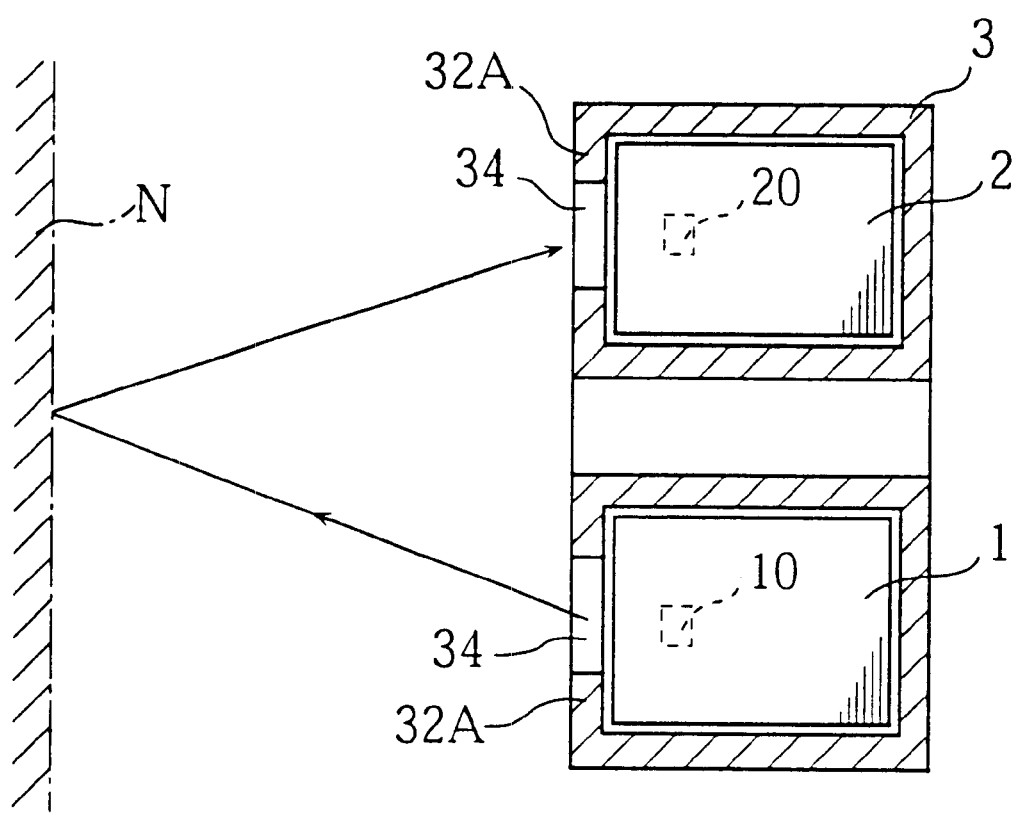
FIG. 11 is a cross sectional view showing another example of photointerrupter in accordance with the present invention.
Figure 12:
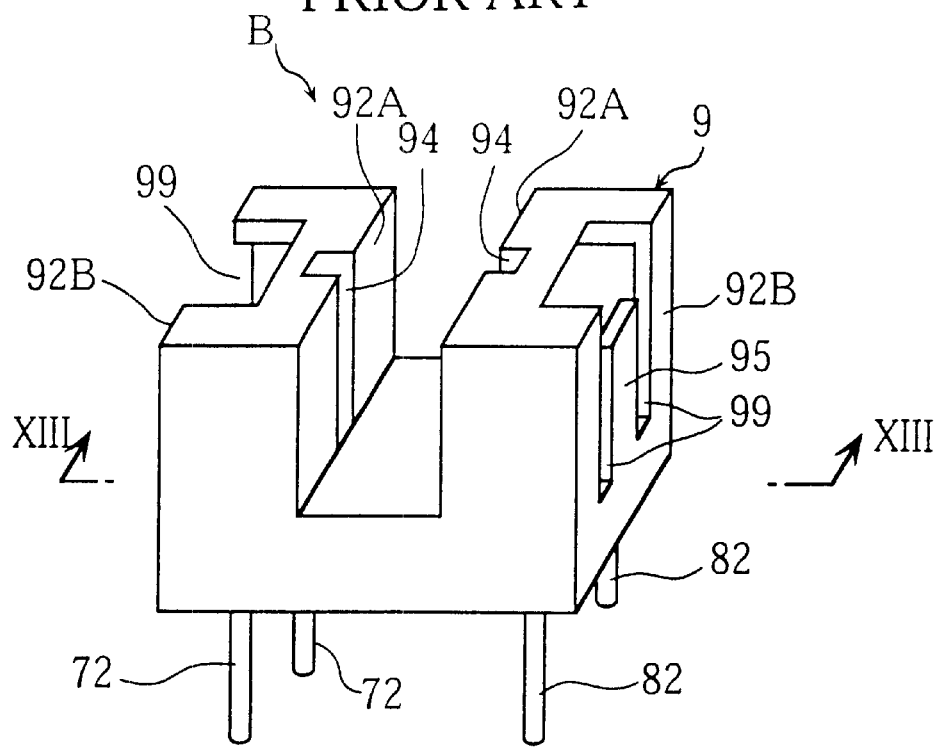
FIG. 12 is a perspective view showing an example of prior art apparatus.
Figure 13:
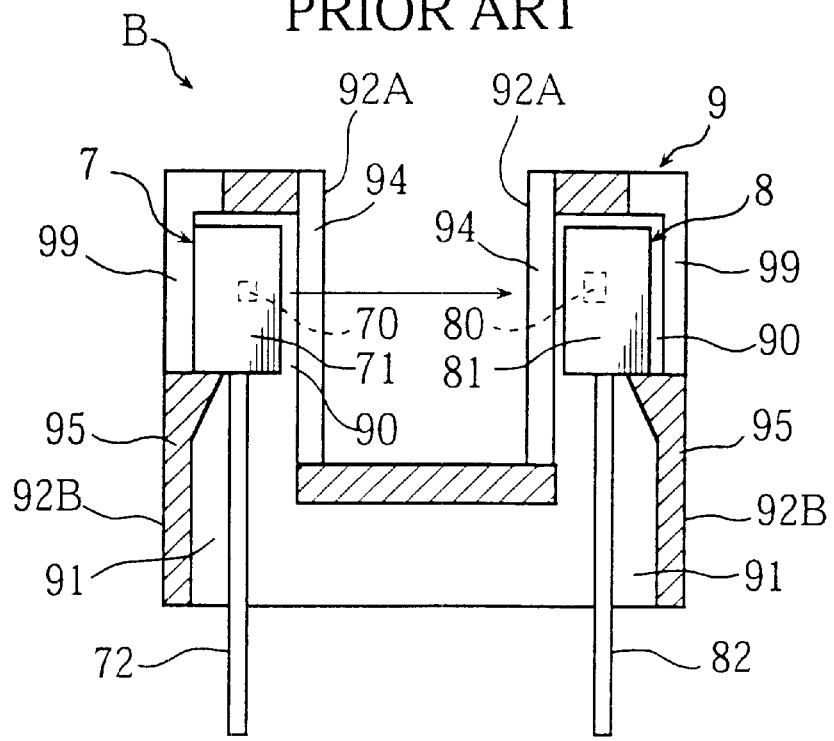
FIG. 13 is a sectional view taken along lines XIII—XIII in FIG. 12.
Figure 14:
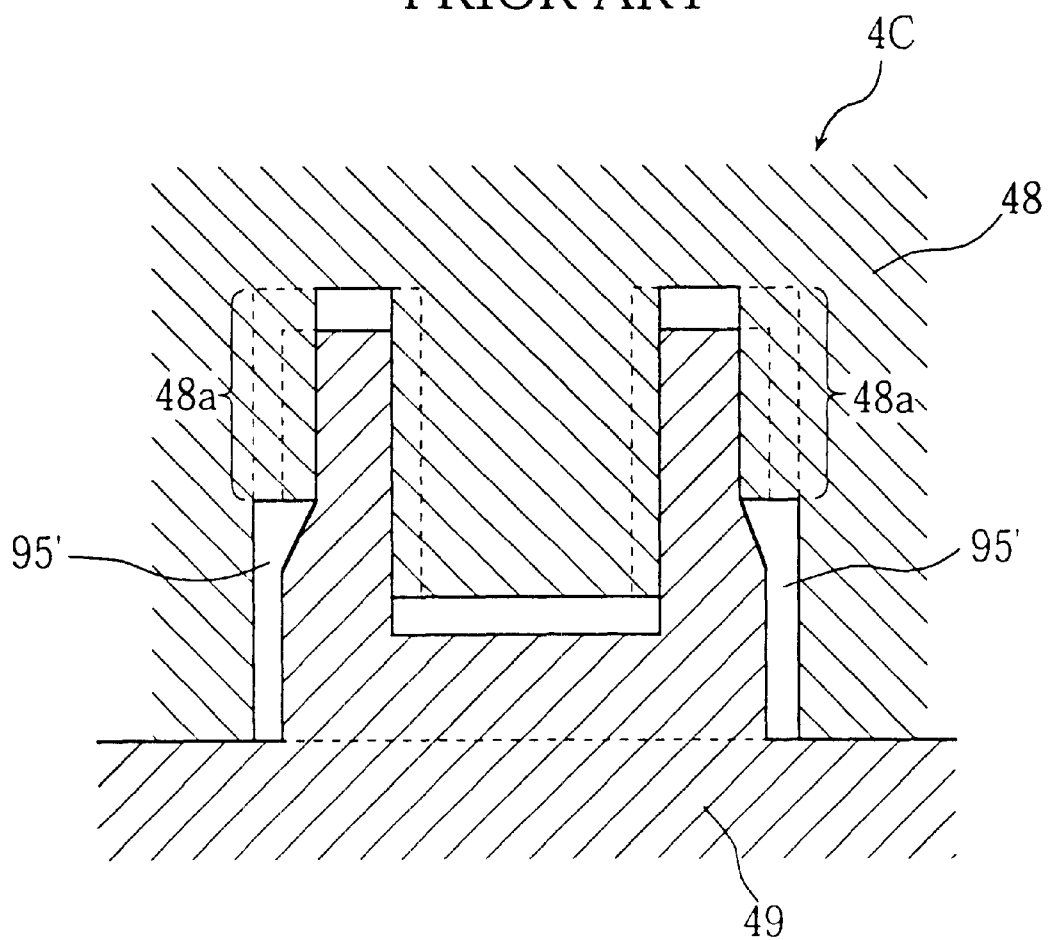
FIG. 14 is a sectional view showing a principal portion of a mold used in a prior art.

For example, a light source other than the above-described LED lamp may be employed. The photodetector may have a different structure from that described above. Further, the present invention may be applied for a reflective type photointerrupter instead of a transmission type photointerrupter. In the reflective type photointerrupter, light emitted from an LED lamp 1 is reflected at an object N and detected by a photodetector 2, as shown in FIG. 11. The reflective type photointerrupter is different from the transmission type photointerrupter with respect to the orientation of a pair of slits 34 formed in the case 3 and the arrangement of first walls 32A formed with the slits 34. However, the basic structure may be similar to that of the transmission type photointerrupter.

What is claimed is:

1. A photointerrupter comprising a light source, a photodetector, and a case, the case including a pair of receiving portions each of which is open at one end for receiving the light source or the photodetector, and a plurality of walls defining the pair of receiving portions;

the plurality of walls of the case including a pair of first walls opposing each other and a pair of second walls each extending transversely to a respective one of the first walls;

each first wall including a respective slit for light transmission and a respective projection which projects into a respective one of the receiving portions for preventing the light source or the photodetector from coming out of the respective receiving portion;

each projection being connected to the respective first wall on an extension line of the respective slit;

each slit extending beyond the thickness of the respective first wall into the respective second wall by as much as the respective projection projects into the respective receiving portion.

2. The photointerrupter according to claim 1, wherein each projection is connected to a longitudinal end edge of the respective slit.

3. The photointerrupter according to claim 1, wherein the case is made of a synthetic resin, the pair of projections being integral with the plurality of walls.

4. The photointerrupter according to claim 1, wherein each projection includes a base end connected to the respective first wall and a tip end projecting into the respective receiving portion for engagement with one of the light source and the photodetector.

5. The photointerrupter according to claim 4, wherein each projection is elastically deformable for allowing movement of the tip end toward the respective first wall.

6. The photointerrupter according to claim 4, wherein a rounded connection is provided between the base end of each projection and the respective first wall.

7. The photointerrupter according to claim 4, wherein each of the light source and the photodetector includes a bottom surface facing the opening of the respective receiving portion and a side surface facing the respective first wall;

the tip end of each projection including a first surface and a second surface for engagement with the bottom surface and the side surface, respectively.

8. The photointerrupter according to claim 1, wherein each of the slits has a first width in the respective first wall and a second width in the respective second wall, the second width being larger than the first width, each projection being connected to the respective first wall at a portion away from a longitudinal end edge of the respective slit, the projection having a width larger than the first width.

9. The photointerrupter according to claim 1, wherein the light source comprises a light emitting element sealed in a resin, and a plurality of leads projecting from the resin in electrical connection with the light emitting element.

10. The photointerrupter according to claim 1, wherein the photodetector comprises a light receiving element sealed in a resin, and a plurality of leads projecting from the resin in electrical connection with the light receiving element.

11. A case for a photointerrupter comprising:

a pair of receiving portions each of which is open at one end for inserting a light source or a photodetector; and a plurality of walls defining the pair of receiving portions;

the plurality of walls including a pair of first walls opposing each other and a pair of second walls each extending transversely to a respective one of the first walls;

each first wall including a respective slit for light transmission and a respective projection which projects into a respective one of the receiving portions for preventing the light source or the photodetector from coming out of the respective receiving portion;

each projection being connected to the respective first wall on an extension line of the respective slit;

each slit extending beyond the thickness of the respective first wall into the respective second wall by as much as the respective projection projects into the respective receiving portion.

\* \* \* \* \*